(12) United States Patent
Hu et al.

(10) Patent No.: US 7,583,082 B1
(45) Date of Patent: Sep. 1, 2009

(54) PARTIALLY PARALLEL MAGNETIC RESONANCE IMAGING USING ARBITRARY K-SPACE TRAJECTORIES WITH IMAGE RECONSTRUCTION BASED ON SUCCESSIVE CONVOLUTION OPERATIONS

(75) Inventors: Peng Hu, Charlottesville, VA (US); Craig H. Meyer, Charlottesville, VA (US)

(73) Assignee: University of Virginia Patent Foundation, Charlottesville, VA (US)

( * ) Notice: Subject to any disclaimer, the term of this patent is extended or adjusted under 35 U.S.C. 154(b) by 0 days.

(21) Appl. No.: 11/785,734

(22) Filed: Apr. 19, 2007

Related U.S. Application Data

(60) Provisional application No. 60/793,087, filed on Apr. 19, 2006, provisional application No. 60/875,724, filed on Dec. 19, 2006.

(51) Int. Cl.
*G01V 3/00* (2006.01)
(52) U.S. Cl. .................................. 324/309; 324/307
(58) Field of Classification Search ......... 324/300–322; 600/407–422
See application file for complete search history.

(56) References Cited

U.S. PATENT DOCUMENTS

| | | | | |
|---|---|---|---|---|
| 5,483,567 A | * | 1/1996 | Swerdloff | 378/4 |
| 5,485,086 A | | 1/1996 | Meyer et al. | |
| 5,910,728 A | * | 6/1999 | Sodickson | 324/309 |
| 6,020,739 A | | 2/2000 | Meyer et al. | |
| 6,064,388 A | * | 5/2000 | Reyzin | 345/418 |
| 6,178,271 B1 | * | 1/2001 | Maas, III | 382/294 |
| 6,326,786 B1 | | 12/2001 | Pruessmann et al. | |
| 6,841,998 B1 | | 1/2005 | Griswold et al. | |
| 6,853,191 B1 | * | 2/2005 | Miller et al. | 324/309 |
| 6,903,551 B2 | * | 6/2005 | Madore | 324/309 |
| 7,132,827 B2 | * | 11/2006 | Griswold et al. | 324/309 |
| 7,202,663 B2 | * | 4/2007 | Huang | 324/307 |
| 7,348,776 B1 | * | 3/2008 | Aksoy et al. | 324/307 |
| 7,439,739 B2 | * | 10/2008 | Beatty | 324/309 |

OTHER PUBLICATIONS

Griswold, Mark A., et al., "Generalized Autocalibrating Partially Parallel Aucquisitons (GRAPPA)" Magnetic Resonance in Medicine 47:1202-1210 (2002).

Pruessmann,Klaas P. et al., "Advance in Sensitivity Encoding With Arbritrary k-Space Trajectories", Mangnetice Resinance in Medicien 46:638-651 (2001).

(Continued)

*Primary Examiner*—Brij B Shrivastav
(74) *Attorney, Agent, or Firm*—Blank Rome LLP

(57) ABSTRACT

In a first step of image formation by MRI or the like, a gridding convolution is performed for each coil using a Kaiser-Bessel kernel, so that each coil channel now contains data on grid points. In the second step, another 2D convolution is performed on each of the gridded coil data sets in either k-space or image space, and all the convolutions are summed up to produce the composite k-space data set for the target coil. In the third step, the composite data set is then transformed to form an un-aliased image for that coil. In the fourth step, the un-aliased images for all the coils are combined using square-root-of-sum-of-squares to form the final reconstructed image.

72 Claims, 4 Drawing Sheets

OTHER PUBLICATIONS

Griswold, M.A. et al., "The GRAPPA Operator" Proc. Intl.Soc. Reson.Med 11:2348 (2003).

Heberlein, K.A. et al., "Segmented Spiral Parallel Imaging Using GRAPPA" Proc. Intl. Soc. Mag. Reson. Med. 11:328 (2004).

Nayak, Krishna S. et al., "Real Time Interactive Coronary MRA", Magnetic Resonnance in Medicine 46:430-435 (2001).

Yeh, Ernest N. et al., "3 Parallel Magnetic Resonance Imaging with Adaptive Radius in k-Space (PARS): Constrained Image Reconstruction using k-Space Locality in Radiofrequency Coil Encoded Data" Magnetice Resonnace in Medicine 53:1383-1392 (2005).

Sodickson, Daniel K. et al. , "Simultaneous Acquisition of Spatial Harmonics (SMASH): Fast Imaging with Radiofrequency Coil Arrays" Magnetic Resonance in Medicine 38:591-603 (1997).

Pruessmann, Klaas P. et al., "SENSE: Sensitivity Encoding for Fast MRI" Magnetic Resonance in Medicine 42:952-962 (1999).

Heidemann, R.M. et al., "Fast Parallel Image Reconstructions With non-Cartesian Trajectories", Proc. Intl. Soc. Mag. Reson. Med. 11:2374 (2003).

Bernstein, Matt A. et al, Handbook of MRI Pulse Sequence, Elsevier Academic Press, 204, pp. 319-323.

Speier, P. et al., "Robust Radial Imaging with Predetermined Isotropic Gradient Delay Correction," Proc. Intl. Soc. Mag. Reson. Med. 14 (2006), p. 2379.

DeZanche, N. et al., "Advances in NMR Probe Technology for Magnetic Field Monitoring," Proc. Intl. Soc. Mag. Reson. Med. 14 (2006) p. 781.

Jung, Youngkyoo, et al., Consistent Non-Cartesian Off-Axis MRI Quality: Calibrating and Removing Multiple Sources of Demodulation Phase Errors, Magnetic Resonance in Medicine 57:206-212 (2007).

Aldefeld, B. et al., "Effects of Gradient Anisotropy in MRI," Magnetic Resonance in Medicine, 39:606-614 (1998).

Davies, Nigel P., et al., "Calibration of Gradient Propagation Delays for Accurate Two-Dimensional Radiofrequency Pulses," Magnetic Resonance in Medicine 53:231-236 (2005).

Duyn, Jeff H., et al., "Simple Correction Method for K-space Trajectory Deviations in MRI," J Magn Reson 1998, 132:150-153.

Peters, Dana C., et al., "Centering the Projection Reconstruction Trajectory: Reducing Gradient Delay Errors," Magn Reson Med 2003, 50:1-6.

Zhang, Yantian, et al., "A Novel K-space Trajectory Measurement Technique," Magn Reson Med 1998, 39:999-1004.

Spielman, Daniel, et al., "Spiral Imaging on a Small-Bore System at 4.7T," Magn Reson Med 1995, 34:580-585.

Hu, P. et al, "Bosco: Parallel Image Reconstruction Based on Successive Convolution Operations," in Proceedings of the 15th Annual Meeting of ISMRM, Seattle, 2006, p. 10.

Barmet, C. et al., "Efficient Iterative Reconstruction for MRI in Strongly Inhomogeneous BO," Proceedings of the 13th Annual Meeting of ISMRM, Miami, 2004, p. 347.

Barmet, C. et al., "Sensitivity encoding and BO Inhomogeneiy - A simultaneous Reconstruction," proceedings of the 14th Annual Meeting of ISMRM, Seattle, 2005, p. 682.

Heberlein, K. A., et al., "Segmented Spiral Parallel Imaging Using GRAPPA, " Proc. Intl. Soc. Mag. Reson. Med 11 (2004) p. 328.

* cited by examiner

US 7,583,082 B1

PARTIALLY PARALLEL MAGNETIC RESONANCE IMAGING USING ARBITRARY K-SPACE TRAJECTORIES WITH IMAGE RECONSTRUCTION BASED ON SUCCESSIVE CONVOLUTION OPERATIONS

REFERENCE TO RELATED APPLICATIONS

The present application claims the benefit of U.S. Provisional Application Nos. 60/793,087, filed Apr. 19, 2006, and 60/875,724, filed Dec. 19, 2006, whose disclosures are hereby incorporated by reference in their entireties into the present disclosure.

STATEMENT OF GOVERNMENT INTEREST

The work leading to the present invention was supported in part by NIH Grant No. R01 HL 079110. The government has certain rights in the invention.

FIELD OF THE INVENTION

The present invention is directed to imaging by magnetic resonance (MR) or the like and more particularly to imaging using successive convolution operations followed by summing.

DESCRIPTION OF RELATED ART

Magnetic resonance imaging (MRI) is a well known imaging technique described, e.g., in U.S. Pat. No. 6,020,739 to Meyer et al, whose disclosure is hereby incorporated by reference in its entirety into the present disclosure. Partially parallel acquisition (PPA) has become an important technique for speeding up magnetic resonance image acquisitions, exploiting advances in the design of multi-coil arrays and multiple-channel receiver systems. Several approaches have been proposed, with the common strategy of using the spatial difference in sensitivity profiles of coil array elements to reduce the aliasing artifacts due to under-sampling in k-space, resulting in shorter image acquisition time. In general, there are two types of techniques: image-space-based (e.g., SENSE) and k-space-based reconstructions (e.g., SMASH and GRAPPA). SENSE gives optimal SNR while reducing aliasing artifacts; however, it requires accurate coil sensitivity profiles, which are not available in some applications. In addition, for non-Cartesian acquisitions, SENSE necessitates the inversion of large scale matrices or multiple iterations to get an artifact reduced image, which is not suitable for some applications such as real-time imaging.

K-space based methods, on the other hand, usually acquire several auto-calibration (ACS) lines in low frequency part of k-space and use those lines in a calibration process which generates a series of linear coefficients that can be applied in the high-frequency k-space to fill in missing data points due to under-sampling. These k-space based methods use the fact that multiple coil sensitivity profiles can be linearly combined to approximate a sinusoidal spatial distribution, effectively shifting the combined k-space data a certain amount in the phase-encoding (FE) direction. This model works well for Cartesian trajectories, because all the data on one sampled PE line are shifted the same amount in the same direction. However, it is not straightforward to apply this model to non-Cartesian trajectories, because the required shift can be different from one point to another along the trajectory.

There have been several non-Cartesian GRAPPA reconstruction methods during the past few years, most of which segment k-space and use different sets of coefficients for different segments, assuming the data points in each segment share the same coefficients. For common non-Cartesian trajectories, e.g., spiral and radial, the number of segments required to get a decent degree of artifact suppression could be very large. All the k-space based methods try to fill in the missing k-space sample points on non-Cartesian trajectories, followed by a gridding operation that interpolates these points onto Cartesian grids.

SUMMARY OF THE INVENTION

It is therefore an object of the invention to overcome the above-noted deficiencies of the prior art.

To achieve the above and other objects, an aspect of various embodiments of the present invention provides, among other things, auto-calibrating k-space-based parallel reconstruction method and system, which addresses the above mentioned problems The acronym for the technique is BOSCO (parallel reconstruction based on successive convolution operations), because two successive convolutions—a gridding convolution followed by a BOSCO convolution—form the basis of the technique.

Typically, the second convolution is performed in k-space. However, it can alternatively be performed in image space, in a manner which will be disclosed below.

Given the 2D nature of non-Cartesian trajectories, they do not have apparent PE and FE directions, so it is reasonable that an intrinsically 2D convolution kernel would naturally be useful for non-Cartesian k-space scanning. In the first step, a gridding convolution is performed for each coil using a Kaiser-Bessel kernel, so that each coil channel now contains data on grid points. In the second step, another 2D convolution is performed on each of the gridded coil data sets, and all the convolutions are summed up in k-space to produce the composite k-space data set for the target coil. In the third step, the composite data set is then transformed to form an un-aliased image for that coil. As in GRAPPA, those two convolutions are repeated with each coil as the target, resulting in multiple un-aliased images with different sensitivity profiles, and all of these coil images are combined in image space using square root of sum of squares or a similar method to generate a final image with a relatively uniform sensitivity profile across the FOV.

BRIEF DESCRIPTION OF THE DRAWINGS

A preferred embodiment of the invention will be set forth in detail with reference to the drawings, in which.

DETAILED DESCRIPTION OF THE PREFERRED EMBODIMENT

Figure 1:
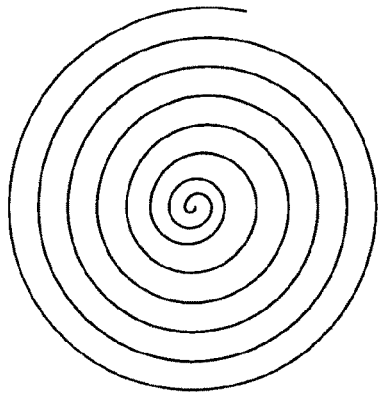
FIG. 1 shows a variable density spiral trajectory.

A preferred embodiment of the invention will be set forth in detail with reference to the drawings, in which like reference numerals refer to like elements or method steps throughout.

In parallel imaging, MR signals are received simultaneously from multiple RF channels, each corresponding to a separate coil with a specific spatial sensitivity profile. We use variable-density and constant-density spiral k-space trajectories as two examples of common non-Cartesian trajectory, although others could also be used. As shown in FIG. 1, the variable-density spirals have two sampling densities, with the inner k-space being fully sampled to support the full FOV and the outer k-space being 2×-8× under-sampled to accelerate the imaging speed. Constant-density spirals have the same sampling density throughout k-space.

Figure 2:
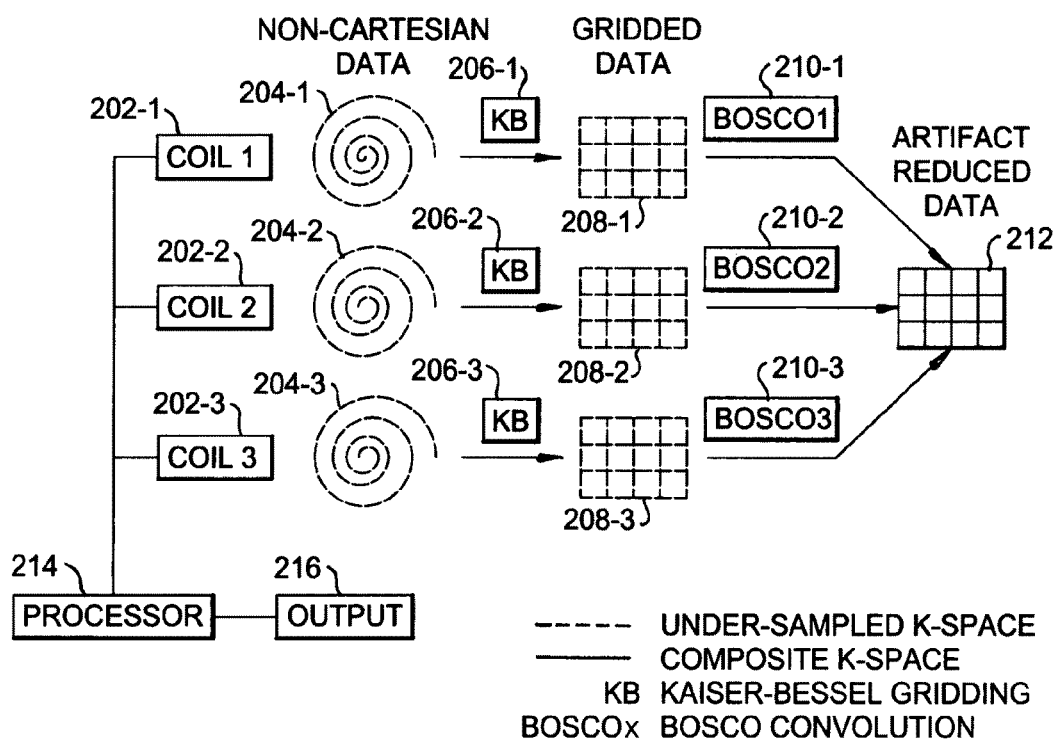
FIG. 2 shows a sequence of operations in a reconstruction scheme according to the preferred embodiment.

FIG. 2 shows details of how the data from multiple coils are combined in this invention. MR coils (specifically COIL 1 202-1, COIL 2 202-2 and COIL 3 202-3) are used to take non-Cartesian data sets 204-1, 204-2 and 204-3, respectively. In the first step, a gridding convolution 206-1, 206-2, 206-3 is performed for each coil using a Kaiser-Bessel kernel, so that each coil channel now contains data on grid points (gridded data 208-1, 208-2, 208-3). In the second step, another 2D convolution 210-1, 210-2, 210-3 is performed on each of the gridded coil data sets, and all the convolutions are summed up in k-space to produce the composite k-space data set for the target coil. In the third step, the composite data set is then transformed to form an un-aliased image 212 for that coil. As in GRAPPA, those two convolutions are repeated with each coil as the target, resulting in multiple un-aliased images with different sensitivity profiles, and all of these coil images are combined in image space using square root of sum of squares or a similar method to generate a final image with a relatively uniform sensitivity profile across the FOV. To determine the BOSCO kernel set for each target, the inner k-space is used for calibration similarly to the way ACS lines are used for calibration in GRAPPA. Using the fully-sampled center of k-space, a 2D fit is performed from multiple coils to the target coil and the BOSCO kernel set that gives the best fit is used for later reconstruction of the whole k-space for the same target coil. As a separate set of BOSCO kernels is needed for each target, a separate calibration is performed for every target coil as well. The BOSCO method can be used to reconstruct data from any k-space trajectory, including Cartesian and non-Cartesian trajectories. A system for performing the above operations includes the coils, a processor 214 for performing the needed calculations and an output 216, such as a display device, for outputting the resulting image.

An exemplary difference between BOSCO and other non-Cartesian parallel reconstruction approaches, but not limited thereto, is that all of the channel data are re-sampled to grid points using the commonly used gridding method. All further processing of the data is based on the gridded dataset. Gridding is essentially a convolution of the non-Cartesian k-space samples with a convolution kernel, re-sampled at grid points. In BOSCO, 1× gridding is performed for all of the channels using a Kaiser-Bessel window. From another perspective, all the previously published k-space based non-Cartesian parallel reconstruction methods try to do a convolution to fill in missing non-Cartesian sampling points followed by a gridding step to generate the reconstructed image; BOSCO, on the other hand, effectively swaps the order of those two operations by performing a gridding first before the convolution in k-space Another exemplary difference between BOSCO and other non-Cartesian parallel reconstruction approaches, but not limited thereto, is that the BOSCO kernels that are used in the k-space convolution are intrinsically un-constrained 2D kernels, whereas the convolution kernels used in other k-space based non-Cartesian parallel reconstruction techniques are essentially constrained 1D or 2D kernels in different orientations.

In BOSCO, coil sensitivity maps are not directly measured as proposed in some parallel reconstruction methods; instead, the sensitivity information is incorporated into a training process, where inner k-space of multiple source channels is used to mimic the inner k-space of the target channel. More specifically, given R as the acceleration factor, every R-th spiral interleaf is extracted from all of the source channels to form an Rx under-sampled inner k-space for each of those source channels, and these under-sampled spiral interleaves are gridded to grid points using the same Kaiser-Bessel kernel as shown above. As to the training target, the inner fully-sampled k-space after gridding is used for each target channel. The grid matrix sizes are scaled such that the spacing between grid points is the same for all the gridding processes throughout the whole reconstruction, i.e., the grid matrices from both the whole k-space and the inner k-space support the same FOV. The BOSCO training tries to find a set of 2D convolution kernels (BOSCO kernels), one for each of the source channels, so that if we convolve each source channel with its corresponding kernel and sum up all the resulting k-space data, we get the k-space that resembles the target k-space best in the minimum mean-square error (MMSE) sense. This problem can be easily formulated as the following linear optimization problem:

$$x = \mathrm{argmin}\{\|Ax-b\|^2\} \quad (1)$$

where x is a column vector containing all the BOSCO kernels for all the source channels, b is all the target k-space values put in a column vector and A is a matrix consisting of appropriate values from the source channels. Specifically, suppose the number of source channels is $N_c$, the k-space grid size used for training is n by n and the BOSCO kernel size is m by m, then x is an $m^2 N_c \times 1$ column vector, b is an $n^2 \times 1$ column vector and A is an $n^2 \times m^2 N_c$ matrix. The element $A_{i,j+p*m^2}$ of matrix A is the k-space point from channel p, the value of which, during the convolution with the BOSCO kernel, will be added to the target k-space point i after weighting by the value of BOSCO kernel element j. In general, equation (1) is an over-determined linear optimization problem, which can be solved by setting the derivatives of equation (1) with respect to every unknown element of x to be zero and solving for x from the resultant linear equations. The solution for (1) is:

$$x = (A^H A) A^H B,$$

where $A^H$ is the complex conjugate transpose of matrix A.

The size of the BOSCO kernels affects the artifact level in the reconstructed image and can be varied as needed. While larger BOSCO kernels tend to give better suppression of aliasing artifacts due to under-sampling, they also add to the computational complexity. From our experience, no significant difference in terms of artifact level is visually detectable if a BOSCO kernel size of at least 5×5 is used for a FOV of 280 mm and a coil setup using Siemens surface coil arrays.

An aspect of various embodiments of the present invention uses each of the physical RF channel data sets as the training target and does a separate BOSCO training for each target, although in general the fully-sampled inner k-space with any coil sensitivity modulation could be used as the target because the sensitivity information is automatically accounted for in the training.

Figure 3:
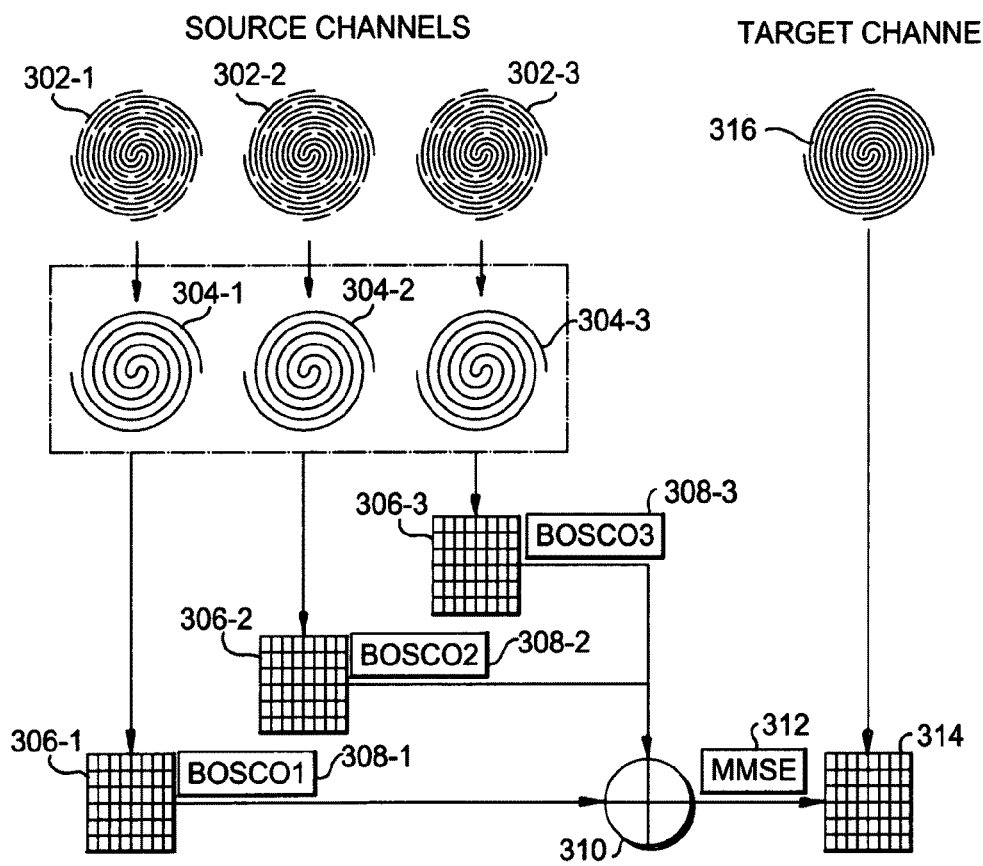
FIG. 3 shows a sequence of operations for kernel training.

The training will be summarized with reference to FIG. 3. Data 302-1, 302-2, 302-3 from the source channels are used. Data 316 from the target channel is used. The target channel data 316 is first gridded to form data 314. For 2× acceleration, every other spiral interleaf is extracted from the inner k-space of all source channels; for constant-density spiral trajectory, that step can be omitted. The resulting data 304-1, 304-2, 304-3 are gridded to provide gridded data 306-1, 306-2, 306-3, which would then be BOSCO correlated in steps 308-1, 308-2, 308-3 and summed in step 310. An MMSE problem is formulated in step 312, as described above, such that the resulting image would be the best fit for the target channel data 314.

BOSCO reconstruction will now be described in greater detail. The BOSCO kernels generated by training represent the optimal way under current imaging settings to mimic the real full-sampled k-space using linear combinations of under-sampled k-space from multiple RF coils with different sensitivity profiles. It should be emphasized that different targets correspond to different kernel sets, while different kernels in a given kernel set correspond to different source channels. In the BOSCO reconstruction, each kernel in the kernel set that corresponds to a current target is convolved with its corresponding source k-space, and the resulting k-space data are added together and inverse Fourier transformed to generate a un-aliased image for the current target. This step is repeated for every target, resulting in one un-aliased image for each target, and each un-aliased image usually has similar localized sensitivities as the target. In the final step, all the target sub-images are combined in the image domain using square root of sum of squares or a similar method, which gives a relatively flat sensitivity profile across the FOV and better SNR compared to phased addition Block-wise BOSCO reconstruction will now be described. In general, for a given target, only channels that have relatively large overlapping sensitivity should be included in the BOSCO reconstruction for that target because channels with little or no overlapping sensitivities would mainly contribute noise instead of signal in the reconstructed image Based on this idea, an effective approach to improve the SNR of BOSCO reconstruction is to divide all the channels into multiple blocks according to certain locality criteria, i.e., only channels that have relatively large overlapping sensitivity profile should be in the same block. For each block, the above mentioned BOSCO training and reconstruction are performed, and again the resulting BOSCO images from different blocks are combined using the square root of the sum of the squares to optimize SNR As the acceleration factor increases, it is reasonable that the number of channels in one block should increase as well in order to achieve satisfactory aliasing artifact suppression.

Figure 4:
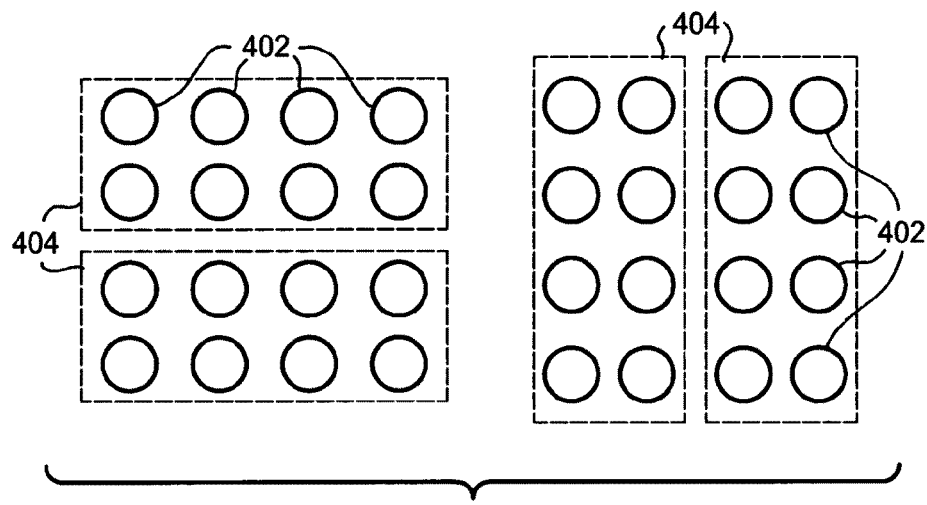
FIG. 4 shows examples of the division of channels into blocks.

FIG. 4 shows two examples of how to divide 16 channels 402 into blocks 404. The two examples could be included in the same block-wise BOSCO reconstruction scheme, in which case every channel is included in two blocks. The BOSCO reconstruction algorithm is repeated for each block.

BOSCO regularization will now be described. The linear optimization problem in BOSCO training implies inversion of the matrix A, which could cause SNR loss if the matrix A is ill-conditioned. As convolution of k-space translates to multiplication in the image domain, the BOSCO reconstruction is equivalent to a linear combination in the image domain of all the channels on a pixel-by-pixel basis. Because all the source channels are under-sampled, every pixel value consists of two components, i.e., the original pixel value and the superimposed value as a result of aliasing from other pixels. Suppose $s_{\rho,j}$ and $A_{\rho,j}$ are the original pixel value and the aliased energy, respectively, for channel j and pixel $\rho$, then the BOSCO reconstruction is equivalent to finding a set of linear weighting factors $W_{\rho,j}$ such that $$\sum_{\rho} W_{\rho,j}(S_{\rho,j} + A_{\rho,j}) = S_{Tj}$$

where $S_{Tj}$ is the desired non-aliased target pixel value. It is easy to see that whatever noise present in the source channel data will also be multiplied by the same weighting factors, resulting in a noise level that depends on the L-2 norm of the vector consisting of all the weighting factors $W_{\rho,j}$. That is to say, given a specific target with a certain signal level, the larger the norm of the vector consisting of all the weighting factors, the more the noise will be amplified. However, by imposing a constraint on the norm of the kernel values in the training process, the SNR can be significantly improved. The modified equation for the BOSCO training would be as follows:

$$x = \mathrm{argmin}\{\|Ax-b\|^2 + \alpha \|x\|^2\} \quad (2)$$

The above equation can be solved using a similar method to that used in solving equation (1), and the solution is:

$$x = (A^H A + \alpha I)^{-1} A^H b,$$

where $A^H$ is the complex conjugate transposition of matrix A, and I is the identity matrix.

In equation (2), the first term controls the accuracy of the fit, i.e., the aliasing artifact level in the reconstructed image, while the second term tries to trade off the aliasing artifact suppression for better SNR. The regularization parameter $\alpha$ can be adjusted in different applications, with larger $\alpha$ yielding better SNR and smaller $\alpha$: giving better artifact suppression.

Figure 5:
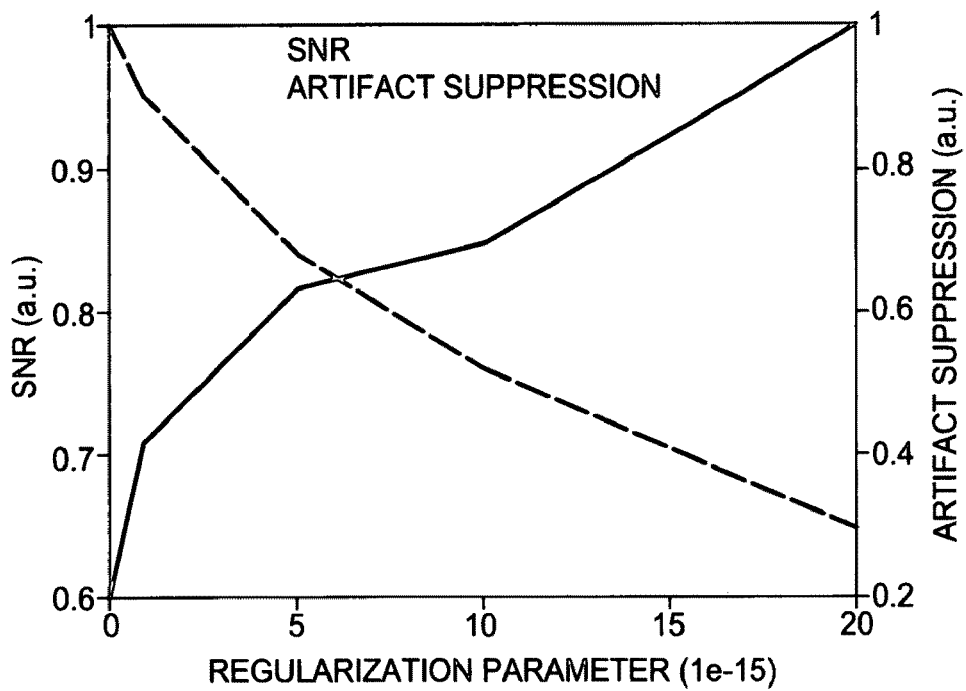
FIG. 5 shows the dependence of SNR and artifact suppression on a regularization parameter.

As shown in FIG. 5, the regularization parameter $\alpha$ has impact on both the SNR and the artifact suppression. As the regularization parameter increases, the SNR of the reconstructed image improves at the expense of the artifact suppression. Regularization parameters corresponding to the intersection of the two curves are preferred.

An alternative way to regularize is to use a regularization target which constrains the image-domain masks corresponding to the BOSCO kernels such that the pixel values are always combined constructively without phase cancellation. That can be achieved by constraining the phase of the mask values to be the conjugate of the phase of the training target and imposing unit amplitude for all the mask values. Accordingly, the regularization target $x_0$ can be generated by taking the Fourier transform of the unit-amplitude phase-constrained 2D masks and assembling the results into a column vector in the same way in which the training target b is assembled. The main difference from $0^{th}$-order Tikhonov regularization is that the prior information vector $x_0$ is the Fourier transform of a unit-amplitude mask whose phase is conjugate to that of the target.

Figure 6:
FIG. 6 shows experimental results.

To demonstrate the clinical application of the BOSCO methods, in-vivo data from healthy volunteers were acquired on a 1.5 T Siemens Avanto Scanner (Siemens Medical Systems, Erlangen, Germany) using two surface coil arrays, and images were reconstructed using BOSCO. As shown in FIG. 6, which is a coronary artery image acquired on a normal volunteer with a variable-density spiral sequence with and under-sampling factor of 2, the BOSCO image has good SNR and is virtually free of aliasing artifacts. The BOSCO algorithm was implemented using Matlab (Mathworks, Natick, Mass., USA).

Figure 7A:
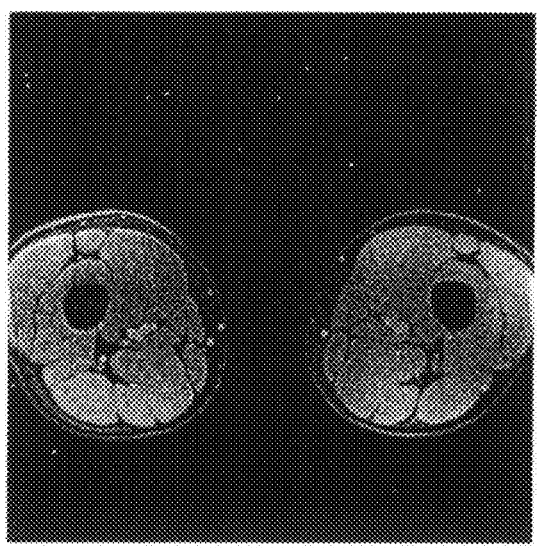
FIGS. 7A and 7B show experimental results without and with regularization, respectively.
Figure 7B:
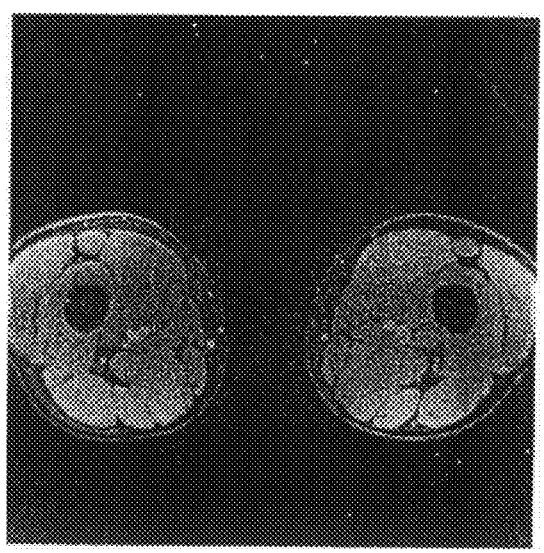

To further demonstrate the effect of regularization on the BOSCO reconstruction, additional in vivo data were acquired using similar coil settings, and two BOSCO reconstructions were performed with and without regularization. As shown in FIGS. 7A and 7B, the regularization gives higher SNR compared to the non-regularized BOSCO image. More specifically, FIGS. 7A and 7B show in vivo images acquired on a healthy volunteer using variable density spiral sequence with an acceleration factor of 4. Both images use the same raw data set, but were reconstructed using non-regularized (FIG. 7A) and regularized (FIG. 7B) BOSCO. The SNR of regularized image is higher than that of the non-regularized image. Since BOSCO only involves convolutions of k-space data with relatively small kernel sizes (5×5 for the image shown in FIG. 6) that can be quickly performed once the kernels are determined, it requires much less computation than a non-Cartesian SENSE reconstruction, which makes it suitable for applications such as real-time imaging. BOSCO is fully auto-calibrating, eliminating the need for measuring accurate sensitivity maps, which can be difficult in some applications.

The above disclosure supposes that the second convolution takes place in k-space. However, an alternative embodiment can be realized in which the second convolution takes place in image space. However, by the convolution theorem of Fourier transforms (R. N. Bracewell, *The Fourier Transform and Its Applications*, McGraw Hill), it is well-known that convolving two arrays together is equivalent to multiplying their Fourier transforms. Thus, it is also possible to implement the second BOSCO convolution as a multiplication in image space. This is likely to be the preferred embodiment for many applications.

The alternative algorithm is as follows:
a) Gridding convolution (same as before).
b) Each channel's data is transformed to form a set of aliased images for the target coil.
c) The BOSCO convolution kernels are zero-padded to the same size of the gridded matrix and then transformed into image space.
d) Each channel's data is then multiplied pixel-by-pixel by the transform of the corresponding BOSCO kernel, and the resulting images are summed up in image space to form a composite unaliased image for that target coil.
e) The composite images for each of the target coils are then combined using the square-root of the sum of the squares or a similar method to generate a final image with a relatively uniform sensitivity profile across the image.

The above disclosure uses spiral trajectories as an example to show the reconstruction algorithm. BOSCO can be applied for other types of non-Cartesian and Cartesian trajectories with minor adjustments in the algorithm.

Figure 1A:
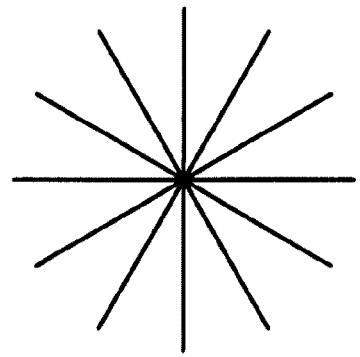
FIG. 1A shows a radial trajectory.

The alternative algorithm for radial trajectories, such as that of FIG. 1A, is as follows:
a) Gridding convolution (same as before).
b) Use the fully-sampled inner k-space of the gridded radial k-space as the training target.
c) Decimate the fully-sampled inner radial k-space by a factor of T, where T is the acceleration factor, and grid the decimated radial views to produce the training source data.
d) BOSCO training using the gridded target and source data produced in steps (b) and (c). (same as before)
e) Use the kernels produced in step (d) in BOSCO convolution. (same as before)

f) Summing up the twice convolved data to produce a composite data. (same as before)
g) Combine the images from different targets using square-root of sum of squares to produce the final reconstructed image. (same as before)

Figure 8:
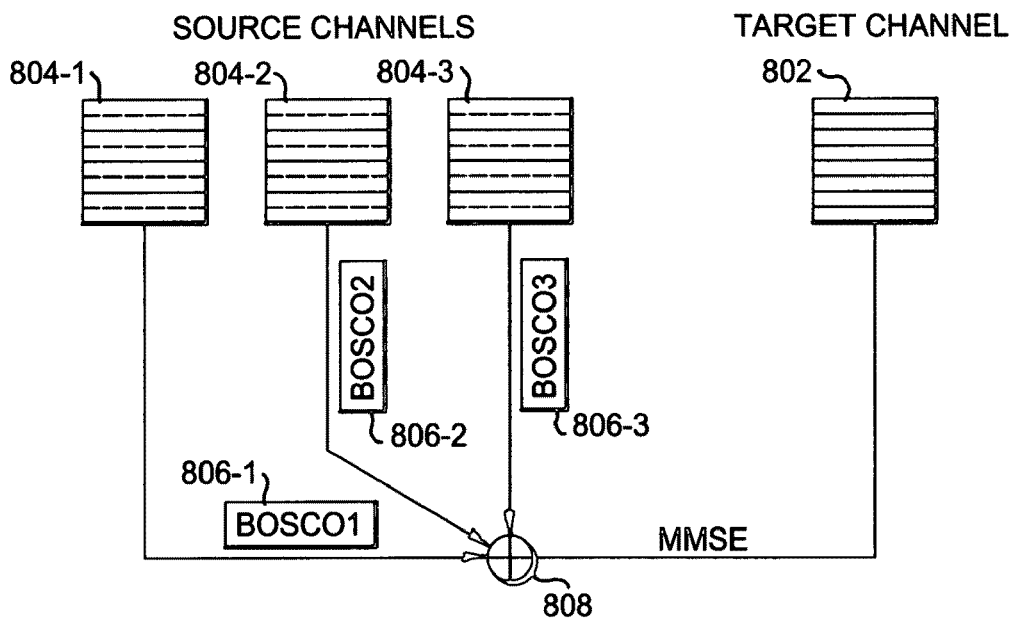
FIG. 8 shows a Cartesian embodiment.

For Cartesian trajectories, since the data points are already on grids, no gridding operation is needed in BOSCO. Except for this difference, the algorithm is the same as that of non-Cartesian trajectories. The alternative algorithm for Cartesian trajectories is as follows, with reference to FIG. 8:
a) Use the fully sampled inner k-space (including the auto-calibration lines) as the training target 802.
b) Use the under-sampled inner k-space (excluding the auto-calibration lines) as the training source 804-1, 804-2, 804-3.
c) BOSCO training in steps 806-1, 806-2, 806-3 using the target and source data produced in steps 802, 804-1, 804-2, 804-3.
d) Summing up the twice convolved data in step 808 to produce a composite data. (same as before)
e) Combine the images from the different targets using square-root of sum of squares to produce the final reconstructed image. (same as before).

The above disclosure uses 2D trajectories as an example to show the reconstruction algorithm. BOSCO can also be applied on 3D spiral, radial and Cartesian trajectories, in which case the BOSCO kernels should be 3D kernels in k-space, the gridding should be a 3D gridding, the BOSCO convolution should be a 3D convolution, the BOSCO training target should be a 3D data set, the BOSCO training source should be a 3D data set, and the BOSCO training is a 3D calibration.

While a preferred embodiment of the present invention and variations thereon have been set forth in detail above, those skilled in the art who have reviewed the present disclosure will readily appreciate that other embodiments can be realized within the scope of the invention. For example, numerical values are illustrative rather than limiting, as are references to specific brand names or products. Therefore, the present invention should be construed as limited only by the appended claims.

We claim:

1. A method for forming an image of an object, the method comprising:
   (a) taking a plurality of sets of non-Cartesian image data of the object, using non-Cartesian imaging trajectories;
   (b) performing a gridding convolution on each of the plurality of sets of non-Cartesian image data to convert said each of the plurality of sets of raw image data into a set of gridded image data; and
   (c) forming the image, using the sets of gridded image data formed in step (b).

2. The method of claim 1, wherein step (a) is performed through magnetic resonance imaging (MRI), the non-Cartesian image data correspond to MRI k-space data, and the plurality of sets of non-Cartesian image data correspond to a plurality of radio-frequency (RF) receiver channels.

3. The method of claim 2, wherein the non-Cartesian imaging trajectories are spiral trajectories.

4. The method of claim 3, wherein the spiral trajectories are variable-density spiral trajectories.

5. The method of claim 3, wherein the spiral trajectories are constant-density spiral trajectories.

6. The method of claim 2, wherein the non-Cartesian imaging trajectories are radial trajectories.

7. The method of claim 2, wherein step (c) comprises:
(i) performing a second convolution on the gridded image data to produce twice convolved data; and
(ii) summing the twice convolved data to produce a composite data set.

8. The method of claim 7, wherein steps (c)(i) and (ii) are performed in k-space, and wherein step (c) further comprises Fourier transforming the composite data set from k-space to form the image.

9. The method of claim 8, wherein step (c) further comprises forming an image for each receiver channel and combining the images using square-root of sum of squares.

10. The method of claim 7, wherein step (c)(i) is performed using two-dimensional kernels.

11. The method of claim 10, wherein the two-dimensional kernels are produced by a training process which minimizes a difference between a target data set and a result of convolving a source data set with the two-dimensional kernels.

12. The method of claim 11, wherein the target data set is fully-sampled to support a desired Field Of View (FOV), and the source data set is under-sampled.

13. The method of claim 12, wherein the target data set corresponds to a fully-sampled inner k-space for variable-density spiral trajectories, and wherein the target data set is acquired separately for constant-density spiral trajectories.

14. The method of claim 13, wherein the source data set is a decimated data set from the fully-sampled inner k-space for variable-density spiral trajectories, and wherein the source data set is the under-sampled inner k-space for constant-density spiral trajectories.

15. The method of claim 14, where the decimation is performed through taking every Rth spiral interleaf, where R is the acceleration factor.

16. The method of claim 12, wherein the target data set corresponds to a fully-sampled inner k-space for radial trajectories.

17. The method of claim 16, wherein the source data set is a decimated data set from the fully-sampled inner k-space for radial trajectories.

18. The method of claim 17, where the decimation is performed through taking every Tth radial view, where T is the acceleration factor.

19. The method of claim 11, wherein the training process uses a term having a regularization parameter which is adjusted to give a desired signal-to-noise ratio and a desired artifact suppression.

20. The method of claim 2, further comprising grouping the plurality of channels into blocks in accordance with overlapping sensitivities of the channels, and wherein step (c) comprises forming an image for each of the blocks and combining the images for the blocks into the image.

21. The method of claim 20, wherein the images for the blocks are combined into the image using a square root of a sum of squares of the images of the blocks.

22. The method of claim 7, wherein the steps (i) and (ii) are performed in image space according to Fourier theory by transforming the gridded data and convolution kernels into image space, performing image space point-wise multiplication and summing up the results to produce a composite data set in image space.

23. A system for forming an image of an object, the system comprising:
a plurality of imaging devices for taking a plurality of sets of non-Cartesian image data of the object, using non-Cartesian imaging trajectories;
a processing device, in communication with the imaging devices, for performing a gridding convolution on each of the plurality of sets of non-Cartesian image data to convert said each of the plurality of sets of raw image data into a set of gridded image data and for forming the image, using the sets of gridded image data; and
an output device for outputting the image.

24. The system of claim 23, wherein the imaging devices are magnetic resonance imaging coils, the non-Cartesian image data correspond to MRI k-space data, and the plurality of sets of non-Cartesian image data correspond to a plurality of radio-frequency receiver channels.

25. The system of claim 24, wherein the non-Cartesian imaging trajectories are spiral trajectories.

26. The system of claim 25, wherein the spiral trajectories are variable-density spiral trajectories.

27. The system of claim 26, wherein the spiral trajectories are constant-density spiral trajectories.

28. The system of claim 24, wherein the non-Cartesian imaging trajectories are radial trajectories.

29. The system of claim 24, wherein the processor forms the image by:
(i) performing a second convolution on the gridded image data to produce twice convoluted data; and
(ii) summing the twice convoluted data to produce a composite data set.

30. The system of claim 29, wherein the processor performs steps (i) and (ii) in k-space and wherein step (c) further comprises Fourier transforming the composite data set from k-space to form the image.

31. The system of claim 30, wherein step (c) further comprises forming an image for each receiver channel and combining the images using square-root of sum of squares.

32. The system of claim 31, wherein the processor performs step (i) using two-dimensional kernels.

33. The system of claim 32, wherein the two-dimensional kernels are produced by a training process which minimizes a difference between a target data set and a result of convolving a source data set with the two-dimensional kernels.

34. The system of claim 33, wherein the target data set is fully-sampled to support a desired Field Of View (FOV), and the source data set is under-sampled.

35. The system of claim 34, wherein the target data set corresponds to a fully-sampled inner k-space for variable-density spiral trajectories, and wherein the target data set is acquired separately for constant-density spiral trajectories.

36. The system of claim 35, wherein the source data set is a decimated data set from the fully-sampled inner k-space for variable-density spiral trajectories, and wherein the source data set is the under-sampled inner k-space for constant-density spiral trajectories.

37. The system of claim 36, where the decimation is performed through taking every Rth spiral interleaf, where R is the acceleration factor.

38. The system of claim 34, wherein the target data set corresponds to a fully-sampled inner k-space for radial trajectories.

39. The system of claim 38, wherein the source data set is a decimated data set from the fully-sampled inner k-space for radial trajectories.

40. The system of claim 39, where the decimation is performed through taking every Tth radial view, where T is the acceleration factor.

41. The system of claim 33, wherein the training process uses a term having a regularization parameter which is adjusted to give a desired signal-to-noise ratio and a desired artifact suppression.

42. The system of claim 24, further comprising grouping the plurality of channels into blocks in accordance with overlapping sensitivities of the channels, and wherein step (c) comprises forming an image for each of the blocks and combining the images for the blocks into the image.

43. The system of claim 42, wherein the images for the blocks are combined into the image using a square root of a sum of squares of the images of the blocks.

44. The system of claim 29, wherein the steps (i) and (ii) are performed in image space according to Fourier theory by transforming the gridded data and convolution kernels into image space, performing image space point-wise multiplication and summing up the results to produce a composite data set in image space.

45. A method for forming an image of an object, the method comprising:
 (a) taking a plurality of sets of Cartesian image data of the object, using Cartesian imaging trajectories;
 (b) forming the image, using the sets of image data formed in step (a).

46. The method of claim 45, wherein step (a) is performed through magnetic resonance imaging (MRI), the Cartesian image data correspond to MRI k-space data, and the plurality of sets of Cartesian image data correspond to a plurality of radio-frequency (RF) receiver channels.

47. The method of claim 46, wherein step (b) comprises:
 (i) performing a convolution on the image data to produce convolved data; and
 (ii) summing the convolved data to produce a composite data set.

48. The method of claim 47, wherein steps (b)(i) and (ii) are performed in k-space, and wherein step (b) further comprises Fourier transforming the composite data set from k-space to form the image.

49. The method of claim 48, wherein step (b) further comprises forming an image for each receiver channel and combining the images using square-root of sum of squares.

50. The method of claim 47, wherein step (b)(i) is performed using two-dimensional kernels.

51. The method of claim 50, wherein the two-dimensional kernels are produced by a training process which minimizes a difference between a target data set and a result of convolving a source data set with the two-dimensional kernels.

52. The method of claim 51, wherein the target data set is fully-sampled to support a desired Field Of View (FOV), and the source data set is under-sampled.

53. The method of claim 52, wherein the target data set corresponds to a fully-sampled inner k-space, including the auto-calibration data.

54. The method of claim 53, wherein the source data set corresponds to a under-sampled inner k-space data, excluding the auto-calibration data.

55. The method of claim 51, wherein the training process uses a term having a regularization parameter which is adjusted to give a desired signal-to-noise ratio and a desired artifact suppression.

56. The method of claim 46, further comprising grouping the plurality of channels into blocks in accordance with overlapping sensitivities of the channels, and wherein step (b) comprises forming an image for each of the blocks and combining the images for the blocks into the image.

57. The method of claim 56, wherein the images for the blocks are combined into the image using a square root of a sum of squares of the images of the blocks.

58. The method of claim 47, wherein the steps (i) and (ii) are performed in image space according to Fourier theory by transforming the image data and convolution kernels into image space, performing image space point-wise multiplication and summing up the results to produce a composite data set in image space.

59. A system for forming an image of an object, the system comprising:
 a plurality of imaging devices for taking a plurality of sets of Cartesian image data of the object, using Cartesian imaging trajectories;
 a processing device, in communication with the imaging devices, for forming the image, using the sets of Cartesian image data; and
 an output device for outputting the image.

60. The system of claim 59, wherein the imaging devices are magnetic resonance imaging coils, the Cartesian image data correspond to MRI k-space data, and the plurality of sets of Cartesian image data correspond to a plurality of radio-frequency receiver channels.

61. The system of claim 60, wherein step (b) comprises:
 (i) performing a convolution on the image data to produce convolved data; and
 (ii) summing the convolved data to produce a composite data set.

62. The system of claim 61, wherein steps (b)(i) and (ii) are performed in k-space, and wherein step (b) further comprises Fourier transforming the composite data set from k-space to form the image.

63. The system of claim 62, wherein step (b) further comprises forming an image for each receiver channel and combining the images using square-root of sum of squares.

64. The system of claim 61, wherein step (b)(i) is performed using two-dimensional kernels.

65. The system of claim 64, wherein the two-dimensional kernels are produced by a training process which minimizes a difference between a target data set and a result of convolving a source data set with the two-dimensional kernels.

66. The system of claim 65, wherein the target data set is fully-sampled to support a desired Field Of View (FOV), and the source data set is under-sampled.

67. The system of claim 66, wherein the target data set corresponds to a fully-sampled inner k-space, including the auto-calibration data.

68. The system of claim 67, wherein the source data set corresponds to a under-sampled inner k-space data, excluding the auto-calibration data.

69. The system of claim 65, wherein the training process uses a term having a regularization parameter which is adjusted to give a desired signal-to-noise ratio and a desired artifact suppression.

70. The system of claim 60, further comprising grouping the plurality of channels into blocks in accordance with overlapping sensitivities of the channels, and wherein step (b) comprises forming an image for each of the blocks and combining the images for the blocks into the image.

71. The system of claim 70, wherein the images for the blocks are combined into the image using a square root of a sum of squares of the images of the blocks.

72. The system of claim 61, wherein the steps (i) and (ii) are performed in image space according to Fourier theory by transforming the image data and convolution kernels into image space, performing image space point-wise multiplication and summing up the results to produce a composite data set in image space.

* * * * *